(12) United States Patent
Li et al.

(10) Patent No.: US 10,404,413 B2
(45) Date of Patent: Sep. 3, 2019

(54) EFFICIENT INTERLEAVER DESIGN FOR POLAR CODES

(71) Applicant: QUALCOMM Incorporated, San Diego, CA (US)

(72) Inventors: Jian Li, Beijing (CN); Changlong Xu, Beijing (CN); Chao Wei, Beijing (CN); Jilei Hou, Beijing (CN)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/942,261

(22) Filed: Mar. 30, 2018

(65) Prior Publication Data

US 2018/0294922 A1    Oct. 11, 2018

Related U.S. Application Data

(63) Continuation of application No. PCT/CN2018/078555, filed on Mar. 9, 2018, which is
(Continued)

(51) Int. Cl.
*H03M 13/00* (2006.01)
*H04L 1/00* (2006.01)
*H03M 13/29* (2006.01)
*H03M 13/13* (2006.01)
*H03M 13/27* (2006.01)

(52) U.S. Cl.
CPC .......... *H04L 1/0071* (2013.01); *H03M 13/13* (2013.01); *H03M 13/2707* (2013.01); *H03M 13/2742* (2013.01); *H03M 13/2757* (2013.01); *H03M 13/296* (2013.01); *H04L 1/0057* (2013.01);
(Continued)

(58) Field of Classification Search
None
See application file for complete search history.

(56) References Cited

U.S. PATENT DOCUMENTS 6,105,158 A * 8/2000 Chen ................. H03M 13/09
                                                    714/755
6,151,690 A   11/2000 Peeters et al.
(Continued)

FOREIGN PATENT DOCUMENTS

CN      104219019 A      12/2014
WO      2014190915 A1    12/2014
(Continued)

OTHER PUBLICATIONS

International Search Report and Written Opinion—PCT/CN2017/079903—ISA/EPO—dated Dec. 28, 2017.
(Continued)

*Primary Examiner* — Mujtaba M Chaudry
(74) *Attorney, Agent, or Firm* — Loza & Loza, LLP

(57) ABSTRACT

Aspects of the disclosure relate to wireless communication devices configured to encode information blocks to produce code blocks and interleave the code blocks utilizing an interleaver including a plurality of rows and a plurality of columns, where the number of columns of the interleaver varies between the rows. In some examples, the interleaver includes a right isosceles triangle-shaped matrix of rows and columns. In other examples, the interleaver includes a trapezoid-shaped matrix of rows and columns.

22 Claims, 10 Drawing Sheets

Related U.S. Application Data a continuation-in-part of application No. PCT/CN2017/079903, filed on Apr. 10, 2017.

(52) U.S. Cl.
CPC .......... *H04L 1/0058* (2013.01); *H04L 1/0061* (2013.01)

(56) References Cited

U.S. PATENT DOCUMENTS

| | | | | |
|---|---|---|---|---|
| 6,507,927 | B1* | 1/2003 | Kalliojarvi | H03M 13/4138 714/795 |
| 8,677,227 | B2* | 3/2014 | Gross | H03M 13/1117 714/807 |
| 2005/0091568 | A1* | 4/2005 | Levy | H03M 13/2948 714/755 |
| 2011/0044399 | A1* | 2/2011 | Dowling | H04L 25/03286 375/286 |
| 2012/0054576 | A1* | 3/2012 | Gross | H03M 13/1117 714/752 |
| 2013/0117344 | A1* | 5/2013 | Gross | G06F 17/10 708/490 |
| 2014/0019820 | A1* | 1/2014 | Vardy | H03M 13/13 714/752 |
| 2015/0229337 | A1* | 8/2015 | Alhussien | H03M 13/35 714/773 |
| 2015/0333769 | A1 | 11/2015 | Jeong et al. | |
| 2016/0380763 | A1 | 12/2016 | Ahn et al. | |

FOREIGN PATENT DOCUMENTS

| | | |
|---|---|---|
| WO | 2015123842 A1 | 8/2015 |
| WO | 2015143593 A1 | 10/2015 |

OTHER PUBLICATIONS

NTT DOCOMO: "Discussion on Polar Codes Design", 3GPP TSG RAN WG1 NR Ad-Hoc Meeting, R1-1700867, Jan. 20, 2017, 7 pages.

Dimitris Toumpakaris et al., Reduced-Delay Protection of DSL Systems Against Nonstationary Disturbances, IEEE Transactions on Communications, vol. 52, No. 11, Nov. 2004.

International Search Report and Written Opinion—PCT/CN2018/078555—ISA/EPO—dated May 30, 2018.

* cited by examiner

EFFICIENT INTERLEAVER DESIGN FOR POLAR CODES

PRIORITY CLAIM

The present Application for Patent is a Continuation of PCT Application No. PCT/CN2018/078555 filed in the Chinese Patent Office on Mar. 9, 2018, the entire content of which is incorporated herein by reference as if fully set forth below in its entirety and for all applicable purposes. PCT Application No. PCT/CN2018/078555 claims priority to and the benefit of PCT Application No. PCT/CN2017/079903 filed in the Chinese Patent Office on Apr. 10, 2017, the entire content of which is incorporated herein by reference as if fully set forth below in its entirety and for all applicable purposes.

TECHNICAL FIELD

The technology discussed below relates generally to wireless communication systems, and more particularly, to channel coding utilizing polar codes in wireless communication systems.

BACKGROUND

Block codes, or error correcting codes are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to reliability of the message, enabling correction for any bit errors that may occur due to the noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for wireless communication devices configured to encode information blocks to produce code blocks and interleave the code blocks utilizing an interleaver including a plurality of rows and a plurality of columns, where the number of columns of the interleaver varies between the rows. In some examples, the interleaver includes a right isosceles triangle-shaped matrix of rows and columns. In other examples, the interleaver includes a trapezoid-shaped matrix of rows and columns.

In one aspect of the disclosure, a method of wireless communication at a transmitting wireless communication device is provided. The method includes encoding an information block to produce a code block including a plurality of coded bits, and interleaving the plurality of coded bits utilizing an interleaver to produce an interleaved code block. The interleaver includes a plurality of rows and a plurality of columns, and a number of the plurality of columns varies between the plurality of rows. The method further includes transmitting the interleaved code block to a receiving wireless communication device over a wireless air interface.

Another aspect of the disclosure provides an apparatus configured for wireless communication. The apparatus includes a transceiver, a memory, and a processor communicatively coupled to the transceiver and the memory. The processor is configured to encode an information block to produce a code block including a plurality of coded bits, and interleave the plurality of coded bits utilizing an interleaver to produce an interleaved code block. The interleaver includes a plurality of rows and a plurality of columns, and a number of the plurality of columns varies between the plurality of rows. The processor is further configured to transmit the interleaved code block to a receiving wireless communication device over a wireless air interface.

Another aspect of the disclosure provides an apparatus configured for wireless communication. The apparatus includes means for encoding an information block to produce a code block including a plurality of coded bits, and means for interleaving the plurality of coded bits to produce an interleaved code block. The means for interleaving includes a plurality of rows and a plurality of columns, and a number of the plurality of columns varies between the plurality of rows. The apparatus further includes means for transmitting the interleaved code block to a receiving wireless communication device over a wireless air interface.

Another aspect of the disclosure provides a non-transitory computer-readable medium storing computer executable code. The non-transitory computer-readable medium includes code for encoding an information block to produce a code block including a plurality of coded bits, and code for interleaving the plurality of coded bits utilizing an interleaver to produce an interleaved code block. The interleaver includes a plurality of rows and a plurality of columns, and a number of the plurality of columns varies between the plurality of rows. The non-transitory computer-readable medium further includes code for transmitting the interleaved code block to a receiving wireless communication device over a wireless air interface.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures.

While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
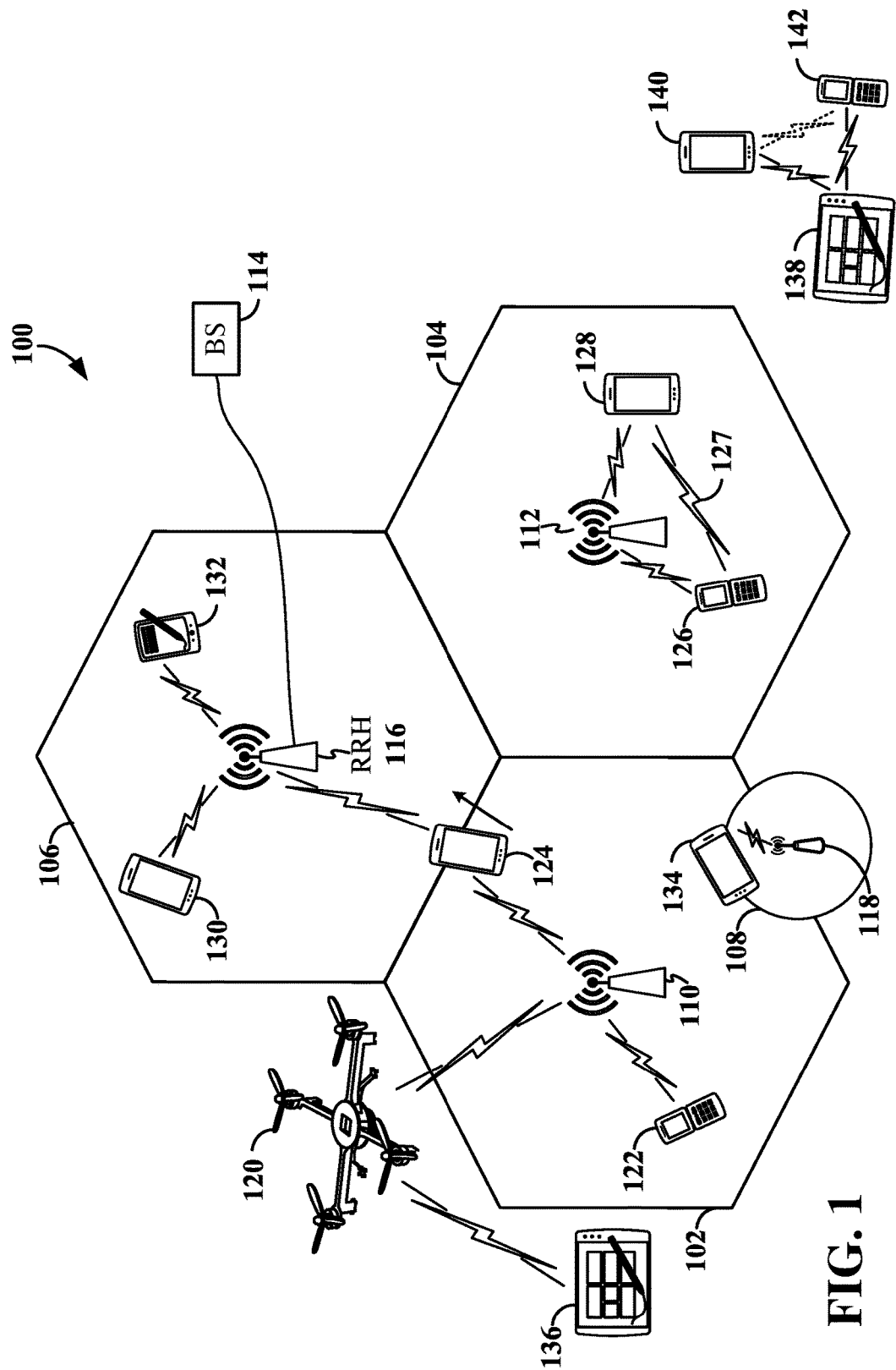
FIG. 1 is a diagram illustrating an example of an access network.

The various concepts presented throughout this disclosure may be implemented across a broad variety of telecommunication systems, network architectures, and communication standards. Referring now to FIG. 1, as an illustrative example without limitation, a simplified schematic illustration of a radio access network 100 is provided. The radio access network 100 may be a next generation (e.g., fifth generation (5G) or New Radio (NR)) radio access network or a legacy (3G or 4G) radio access network. In addition, one or more nodes in the radio access network 100 may be next generation nodes or legacy nodes.

As used herein, the term legacy radio access network refers to a network employing a third generation (3G) wireless communication technology based on a set of standards that complies with the International Mobile Telecommunications-2000 (IMT-2000) specifications or a fourth generation (4G) wireless communication technology based on a set of standards that comply with the International Mobile Telecommunications Advanced (ITU-Advanced) specification. For example, some the standards promulgated by the 3rd Generation Partnership Project (3GPP) and the 3rd Generation Partnership Project 2 (3GPP2) may comply with IMT-2000 and/or ITU-Advanced. Examples of such legacy standards defined by the 3rd Generation Partnership Project (3GPP) include, but are not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

As further used herein, the term next generation radio access network generally refers to a network employing continued evolved wireless communication technologies. This may include, for example, a fifth generation (5G) wireless communication technology based on a set of standards. The standards may comply with the guidelines set forth in the 5G White Paper published by the Next Generation Mobile Networks (NGMN) Alliance on Feb. 17, 2015. For example, standards that may be defined by the 3GPP following LTE-Advanced or by the 3GPP2 following CDMA2000 may comply with the NGMN Alliance 5G White Paper. Standards may also include pre-3GPP efforts specified by Verizon Technical Forum and Korea Telecom SIG.

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors (not shown). A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a respective base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNode B (gNB), or some other suitable terminology.

In FIG. 1, two base stations 110 and 112 are shown in cells 102 and 104; and a third base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the base stations 110, 112, and 114 support cells having a large size. Further, a base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion (not shown) of the network. The backhaul may provide a link between a base station and a core network (not shown), and in some examples, the backhaul may provide interconnection between the respective base stations. The core network may be a part of a wireless communication system and may be independent of the radio access technology used in the radio access network. Various types of backhaul interfaces may be employed, such as a direct physical connection, a virtual network, or the like using any suitable transport network.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quad-copter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service user data traffic, and/or relevant QoS for transport of critical service user data traffic.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or traffic information (e.g., user data traffic) from a base station (e.g., base station 110) to one or more UEs (e.g., UEs 122 and 124) may be referred to as downlink (DL) transmission, while transmissions of control information and/or traffic information originating at a UE (e.g., UE 122) may be referred to as uplink (UL) transmissions. In addition, the uplink and/or downlink control information and/or traffic information may be time-divided into frames, subframes, slots, mini-slots and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A mini-slot may carry less than 7 OFDM symbols or less than 14 OFDM symbols. A subframe may refer to a duration of 1 ms. Multiple subframes may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM) or other suitable multiplexing schemes.

Further, the air interface in the radio access network 100 may utilize one or more duplexing algorithms Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of a mobility management entity (MME). In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
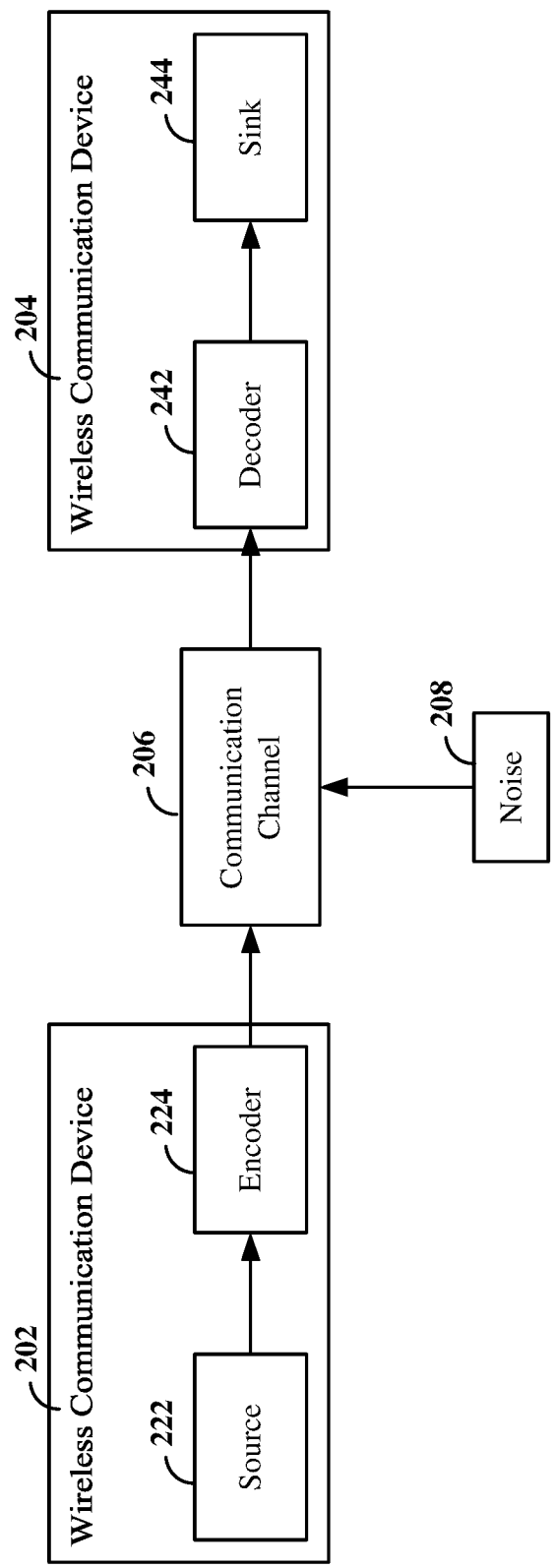
FIG. 2 is a schematic illustration of wireless communication utilizing block codes.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. To provide for reliable communication of the digital message, it is usually beneficial to take into account the noise 208 that affects the communication channel 206.

Block codes, or error correcting codes are frequently used to provide reliable transmission of digital messages over such channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the code rate R is the ratio between the message length and the block length: i.e., R=K/N. Exploitation of this redundancy in the encoded information message is one key to reliability of the message, possibly enabling correction for bit errors that may occur due to the noise 208 or other signal propagation affects. That is, a decoder 242 at the second (receiving) wireless communication device 204 can take advantage of the redundancy to possibly recover the information message even though bit errors may occur, in part, due to the addition of noise to the channel, etc.

Many examples of such error correcting block codes are known to those of ordinary skill in the art, including Hamming codes, Bose-Chaudhuri-Hocquenghem (BCH) codes, turbo codes, tail-biting convolutional codes (TBCC), and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

Polar codes are linear block error correcting codes. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

However, even with the best error correcting codes, if the communication channel 206 experiences a deep fade, the bit error rate may exceed what can be compensated. Accordingly, many wireless communication networks utilize interleavers to further improve data reliability.

Interleavers may also be used in the coding process itself to provide extrinsic information for iterative decoding. For example, turbo codes may utilize a quadratic permutation polynomial (QPP) interleaver to support parallel decoding. Similarly, tail-biting convolutional codes may utilize a sub-block interleaver for the control channel. The sub-block interleaver includes a rectangular shaped matrix of rows and columns. There are typically thirty-two columns, but the number of rows is dependent upon the number of coded bits in a code block. The coded bits are fed into the sub-block interleaver on a row-by-row basis. The matrix is then rearranged using an inter-column permutation, after which the coded bits are read out on a column-by-column basis.

However, for polar codes with higher-order modulation (e.g., 16-QAM or 64-QAM), traditional interleaver designs, such as QPP interleavers or sub-block interleavers, fail to provide sufficient performance in terms of the Signal-to-Noise Ratio (SNR) and Block Error Rate (BLER), especially under Additive White Gaussian Noise (AWGN). Therefore, in accordance with aspects of the present disclosure, a new interleaver design, which may be utilized for polar codes or other suitable types of codes (e.g., turbo or TBCC), is provided. The interleaver design is based on a right isosceles triangle-shaped matrix or trapezoid-shaped matrix of rows and columns, where the number of columns varies between the rows. For example, a right isosceles triangle-shaped matrix may be designed with the length of the two equal sides set to the smallest integer P that satisfies the equation $P*(P+1)/2 \geq N$, where N is the number of coded bits in a code block.

In an exemplary operation of the interleaver, the coded bits of a code block may be fed into successive rows of the interleaver from top to bottom and read out of successive columns of the interleaver from left to right. Thus, the first coded bit in the first row is the first coded bit read out of the first column. With this interleaver design, the number of coded bits in each row decreases with the highest number of coded bits in the first row and the lowest number of coded bits in the last row. As such, the number of coded bits between adjacent coded bits in adjacent rows varies, and in particular, the number of coded bits between adjacent coded bits in adjacent rows decreases as the row number increases. For example, the number of coded bits between the left-most coded bit in the first row and the left-most coded bit in the second row is P, whereas the number of coded bits between the left-most coded bit in the second row and the left-most coded bit in the third row is P−1, and so on.

In some aspects of the present disclosure, after the last coded bit of the code block is fed into the interleaver, any remaining rows or portions thereof in the matrix may be filled with null values. When reading out the columns of the matrix, these null values may be skipped to read out only the coded bits. The interleaver design excluding the rows containing only null values may therefore be considered to be a trapezoid-shaped matrix.

In addition, the inter-column permutation step performed with the sub-block interleaver is removed to reduce complexity and latency. In some examples, the performance of this new interleaver design may be comparable to that of a random interleaver, and as such, is suitable for polar codes with higher-order modulation.

Figure 3:
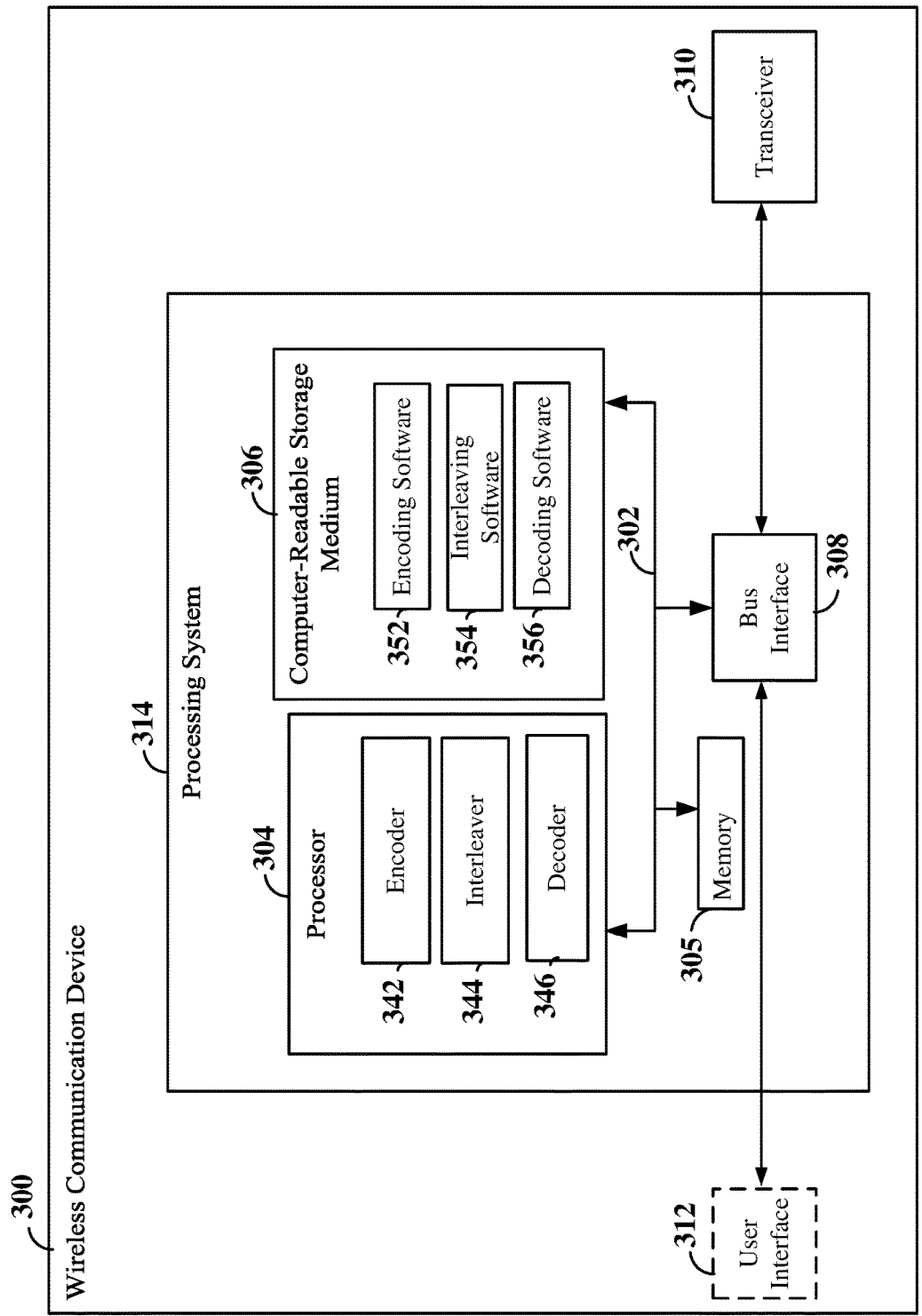
FIG. 3 is a block diagram illustrating an example of a hardware implementation for a wireless communication device employing a processing system according to some aspects of the present disclosure.

FIG. 3 is a block diagram illustrating an example of a hardware implementation for a wireless communication device 300 employing a processing system 314. For example, the wireless communication device 300 may be a user equipment (UE), a base station, or any other suitable apparatus or means for wireless communication.

In accordance with various aspects of the disclosure, an element, or any portion of an element, or any combination of elements may be implemented with a processing system 314 that includes one or more processors 304. Examples of processors 304 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 304, as utilized in a wireless communication device 300, may be used to implement any one or more of the processes described below and illustrated in FIGS. 4-5.

In this example, the processing system 314 may be implemented with a bus architecture, represented generally by the bus 302. The bus 302 may include any number of interconnecting buses and bridges depending on the specific application of the processing system 314 and the overall design constraints. The bus 302 links together various circuits including one or more processors (represented generally by the processor 304), a memory 305, and computer-readable media (represented generally by the computer-readable medium 306). The bus 302 may also link various other circuits such as timing sources, peripherals, voltage regulators, and power management circuits, which are well known in the art, and therefore, will not be described any further. A bus interface 308 provides an interface between the bus 302 and a transceiver 310. The transceiver 310 provides a means for communicating with various other apparatus over a transmission medium. Depending upon the nature of the apparatus, an optional user interface 312 (e.g., keypad, display, speaker, microphone, joystick) may also be provided. It should be understood that the user interface 312 may not be provided in some devices, such as a base station.

The processor 304 is responsible for managing the bus 302 and general processing, including the execution of software stored on the computer-readable medium 306. The software, when executed by the processor 304, causes the processing system 314 to perform the various functions described below for any particular apparatus. The computer-readable medium 306 may also be used for storing data that is manipulated by the processor 304 when executing software.

One or more processors 304 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 306. The computer-readable medium 306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 306 may reside in the processing system 314, external to the processing system 314, or distributed across multiple entities including the processing system 314. The computer-readable medium 306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 304 may include circuitry configured for various functions. For example, the processor 304 may include an encoder 342, which may in some examples operate in coordination with encoding software 352 stored in the computer-readable storage medium 306. The encoder 342 may be configured to code an information block to produce a code block of length N after puncturing. In some examples, the encoder 342 is a polar encoder. However, the encoder 342 is not limited to polar encoders and may include any suitable encoder, such as a turbo encoder, tail-biting convolutional encoder, or other type of encoder.

In examples where the encoder 342 is a polar encoder, the polar encoder 342 may be configured to polar code the information block to produce a polar code block having a length of N. For example, the information block may be represented as an information bit vector $u=(u_1, u_2, \ldots, u_N)$. The polar encoder 342 may polar code the information bit vector to produce the polar code block as an encoded bit vector $c=(c_1, c_2, \ldots, c_N)$ using a generating matrix $G_N = B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \cdots & 0 & 0 & 0 & 0 \\ 1 & 0 & 1 & & 0 & 0 & 0 & 0 \\ \vdots & & \ddots & & & \vdots & & \\ 1 & 0 & 0 & & 1 & 0 & 0 & 0 \\ 1 & 1 & 0 & & 1 & 1 & 0 & 0 \\ 1 & 0 & 1 & \cdots & 1 & 0 & 1 & 0 \\ 1 & 1 & 1 & & 1 & 1 & 1 & 1 \end{bmatrix}$$

The polar encoder 342 may then generate the polar code block as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar code block c. In some examples, the information bit vector u may include a number of information bits, denoted K, and a number of frozen bits, denoted f. Frozen bits are bits that are set to a suitable predetermined value, such as 0 or 1. Thus, the value of the frozen bits may generally be known at both the transmitting device and the receiving device. The polar encoder 342 may determine the number of information bits and the number of frozen bits based on the code rate R. For example, the polar encoder 342 may select a code rate R from a set of one or more code rates and select K=N×R bits in the information block to transmit information. The remaining (N−K) bits in the information block may then be fixed as frozen bits f.

In order to determine which information block bits to set as frozen bits, the polar encoder 342 may further analyze the wireless channel over which the polar code block may be sent. For example, the wireless channel for transmitting the polar code block may be divided into a set of sub-channels, such that each encoded bit in the polar code block is transmitted over one of the sub-channels. Thus, each sub-channel may correspond to a particular coded bit location in the polar code block (e.g., sub-channel-1 may correspond to coded bit location containing coded bit $c_1$). The polar encoder 342 may identify the K best sub-channels for transmitting the information bits and determine the original bit locations in the information block contributing to (or corresponding to) the K best sub-channels. For example, based on the generating matrix, one or more of the original bits of the information block may contribute to each of the coded bits of the polar code block. Thus, based on the generating matrix, the polar encoder 342 may determine K original bit locations in the information block corresponding to the K best sub-channels, designate the K original bit locations in the information block for information bits, and designate the remaining original bit locations in the information block for fixed bits.

In some examples, the polar encoder 342 may determine the K best sub-channels by performing density evolution or Gaussian approximation. Density evolution is generally known to those skilled in the art. Gaussian approximation is a lower complexity version of density evolution, and is also generally known to those skilled in the art. In general, the polar encoder 342 may perform density evolution or Gaussian approximation to calculate a respective bit error probability (BEP) and/or log likelihood ratio (LLR) for each of the for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the polar code block, the LLRs of each of the original bit locations may be derived from the known LLRs of the coded bit locations by performing density evolution or Gaussian approximation. Based on the calculated original bit location LLRs, the polar encoder 342 may sort the sub-channels and select the K best sub-channels (e.g., "good" sub-channels) to transmit the information bits.

The polar encoder 342 may then set the original bit locations of the information block corresponding to the K best sub-channels as including information bits and the remaining original bit locations corresponding to the N−K sub-channels (e.g., "bad" sub-channels) as including frozen bits. Bit-reversal permutation may then be performed by applying the bit-reversal permutation matrix $B_N$ described above to the N bits (including K information bits and N−K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar code block.

The processor 304 may further include an interleaver 344, which may in some examples operate in coordination with interleaving software 354 stored in the computer-readable medium 306. The interleaver 344 may also operate in coordination with the encoder 342 to interleave the coded bits in the code block to produce an interleaved code block. The encoder 342 may then transmit the interleaved code block via the transceiver 310.

In various aspects of the present disclosure, the interleaver 344 includes a plurality of rows and columns, where the number of columns varies between rows. In some examples, the interleaver 344 includes a right isosceles triangle-shaped matrix or trapezoid-shaped matrix of rows and columns. For example, a right isosceles triangle-shaped matrix interleaver 344 may include two equal sides whose length is set to the smallest integer P that satisfies the equation P*(P+1)/2≥N, where N is the number of coded bits in the code block.

The interleaver 344 may be configured to feed the coded bits of the code block into successive rows of the matrix, such that the first coded bit in the code block is the left-most coded bit in the first row. The interleaver 344 may further be configured to read out the coded bits from successive columns of the matrix from left to right. Thus, the first coded bit in the first row is the first coded bit read out of the first column With this interleaver design, the number of coded bits in each row decreases with the highest number of coded bits in the first row and the lowest number of coded bits in the last row. As such, the number of coded bits between adjacent coded bits in adjacent rows varies, and in particular, the number of coded bits between adjacent coded bits in adjacent rows decreases as the row number increases. For example, the number of coded bits between the left-most coded bit in the first row and the left-most coded bit in the second row is P, whereas the number of coded bits between the left-most coded bit in the second row and the left-most coded bit in the third row is P−1, and so on.

In some examples, after the last coded bit of the code block is fed into the matrix, the interleaver 344 may further be configured to fill any remaining rows or portions thereof in the matrix with null values. In other examples, the null bits may be fed into the matrix first, followed by the coded bits. When reading out the columns of the matrix, the interleaver 344 may also be configured to skip these null values to read out only the coded bits. If the null values are fed into the matrix after the coded bits, excluding the rows containing all null values in the matrix may result in an interleaver 344 having a trapezoid-shaped matrix.

Further, the processor 304 may include a decoder 346, which may in some examples operate in coordination with decoding software 356 stored in the computer-readable medium 306. The decoder 346 may be configured to receive an interleaved code block via the transceiver 310, de-interleave the interleaved code block based on the right isosceles triangle-shaped interleaver design described above to produce the code block, and decode the code block to produce the original information block. In some examples, the decoder 346 may be a polar decoder 346. In other examples, the decoder 346 may include any suitable decoder, such as a turbo decoder, tail-biting convolutional decoder, or other type of decoder.

In examples where the decoder 346 is a polar decoder 346, the polar decoder 346 may perform successive cancellation (SC) polar decoding or SC polar list decoding to decode the polar code block. For example, the polar decoder 346 may be configured to receive a noisy version of c, and to decode c or, equivalently, u, using a simple successive cancellation (SC) decoding algorithm. Successive cancellation decoding algorithms typically have a decoding complexity of 0 (N log N) and can achieve Shannon capacity when N is very large. However, for short and moderate block lengths, the error rate performance of polar codes significantly degrades.

Therefore, in some examples, the polar decoder 346 may utilize a SC-list decoding algorithm to improve the polar coding error rate performance. With SC-list decoding, instead of only keeping one decoding path (as in simple SC decoders), L decoding paths are maintained, where L>1. At each decoding stage, the polar decoder 346 discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the polar decoder 346 will have a list of L candidates for $u_1^N$, out of which the most likely candidate is selected. Thus, when the polar decoder 346 completes the SC-list decoding algorithm, the polar decoder 346 returns a single information block.

Figure 4:
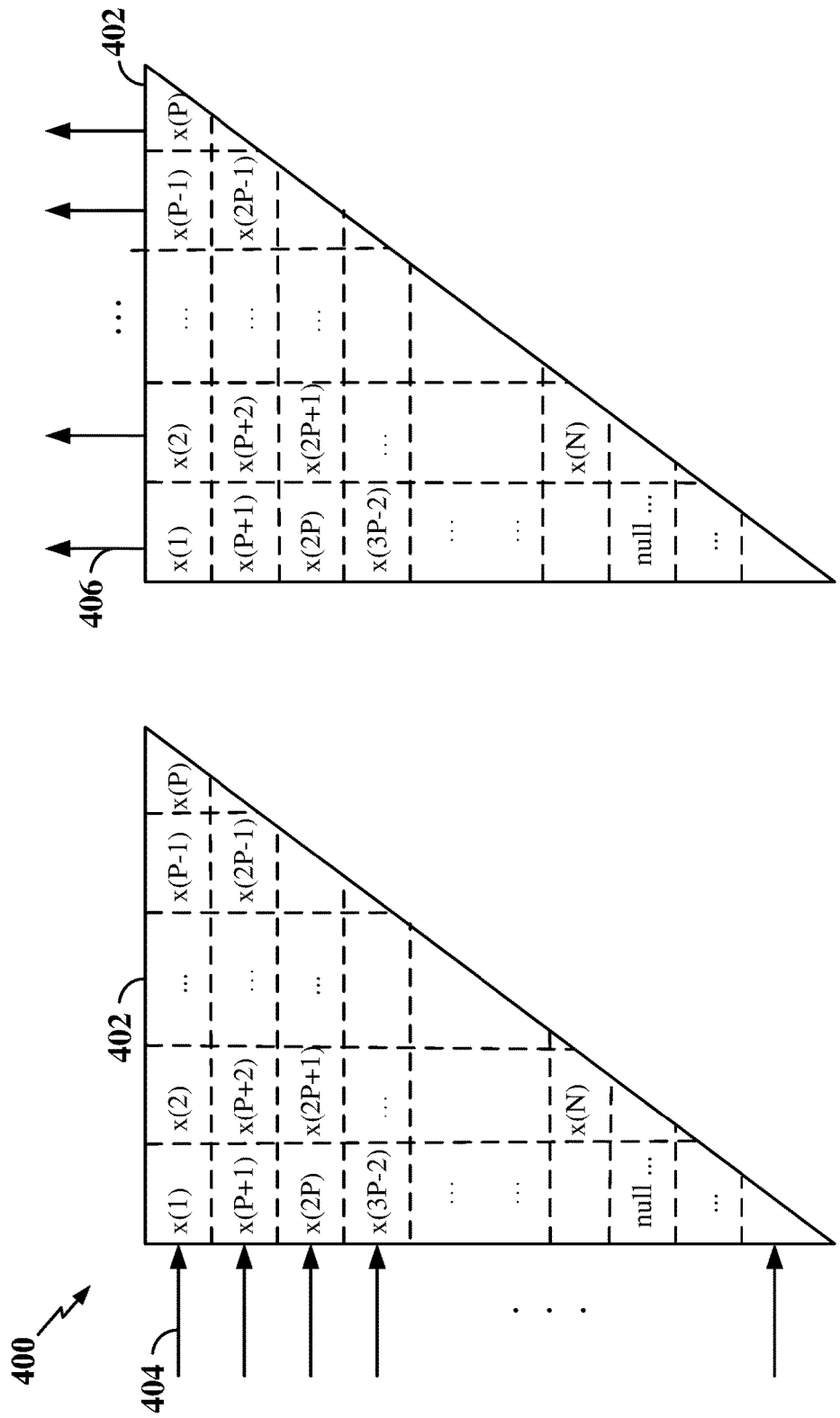
FIG. 4 is a diagram illustrating an example of an interleaver design according to some aspects of the present disclosure.

FIG. 4 is a diagram illustrating an example of an interleaver design according to some aspects of the present disclosure. In the example shown in FIG. 4, the interleaver 400 includes a right isosceles triangle-shaped matrix 402 of rows 404 and columns 406. A code block including coded bits x(1) to x(N), with a length of N, is fed into successive rows 404 of the matrix, such that the first coded bit x(1) in the code block is the left-most coded bit in the first row 404. The length of the first row 404 is set to smallest integer P that satisfies the equation P*(P+1)/2≥N. In addition, the length of the first column 406 is equal to the length of the first row 404, and as such, is also set to P. Thus, the first row 404 includes coded bits x(1) to x(P).

With this interleaver 400 design, the number of coded bits in each row 404 decreases with the highest number of coded bits being in the first row and the lowest number of coded bits being in the last row. For example, the second row of the matrix includes coded bits x(P+1) to x(2P−1), the third row of the matrix includes coded bits x(2P) to x(3P−3), and so on. As such, the number of coded bits between adjacent coded bits in adjacent rows varies, and in particular, the number of coded bits between adjacent coded bits in adjacent rows decreases as the row number increases. For example, the number of coded bits between the left-most coded bit in the first row and the left-most coded bit in the second row is P, whereas the number of coded bits between the left-most coded bit in the second row and the left-most coded bit in the third row is P−1, and so on.

After the last coded bit x(N) is fed into the matrix, null values (null) may be inserted into any remaining rows or portions thereof. In some examples, the null values may be fed into the matrix 402 first, followed by the coded bits.

The coded bits may then be read out from successive columns 406 of the matrix 402 from left to right, skipping any null values. Thus, the first coded bit (left-most coded bit) in the first row is the first coded bit read out of the first column. In the example shown in FIG. 4, the output is x(1), x(P+1), x(2P), x(3P−2), x(2), x(P+2), x(2P+1), x(N), x(P−1), x(2P−1), x(P), skipping any null values in the matrix. By excluding the rows containing all null values, the interleaver 400 design shown in FIG. 4 may be considered to be a trapezoid-shaped matrix.

Figure 5:
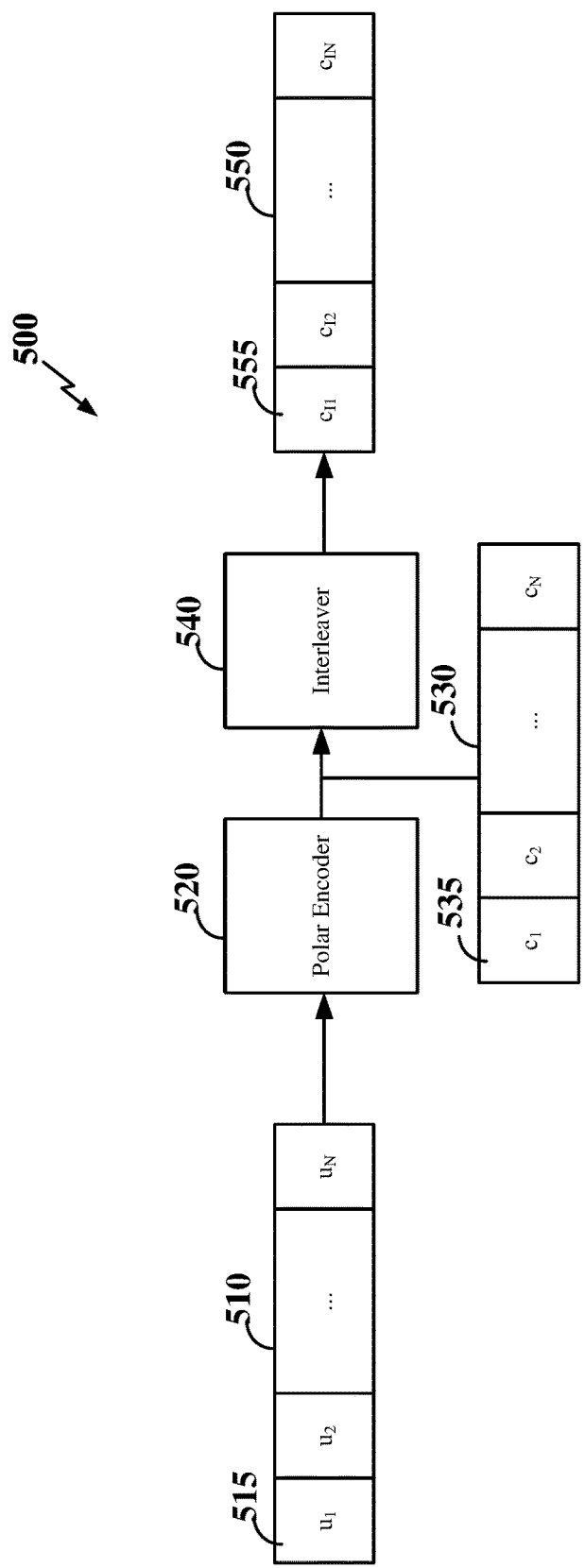
FIG. 5 is a diagram illustrating an example operation of polar coding and interleaving according to some embodiments.

FIG. 5 is a diagram illustrating an example operation 500 of polar coding and interleaving according to some embodiments. In FIG. 5, an information block 510 is provided including N original bit locations 515, each containing an original bit ($u_1, u_2, \ldots, u_N$). Each of the original bits corresponds to an information bit or a frozen bit. The information block 510 is received by a polar encoder 520. The polar encoder 520 polar encodes the information block to produce a polar codeword 530 including N coded bit locations 435, each containing a coded bit ($c_1, c_2, \ldots, c_N$).

The polar codeword 530 is received by an interleaver block 540. The interleaver block 540 applies a right isosceles triangle-shaped or trapezoid-shaped interleaver matrix to the polar codeword 530 to interleave the coded bits from the polar codeword to produce an interleaved polar codeword 550. Thus, at the output of the interleaver block 540 is an interleaved codeword 550 including N coded bit locations 555, each including one of the coded bits ($c_1, c_2, \ldots, c_N$) in an interleaved order ($c_{I1}, c_{I2}, \ldots, c_{IN}$). It should be noted that the polar encoder 520 may, in some examples, correspond to the polar encoder 342 and polar encoding software 352 shown and described above in connection with FIG. 3 or the polar encoder 224 shown and described above in connection with FIG. 2. In addition, the interleaver block 540 may, in some examples, correspond to the interleaver 400 shown and described above in connection with FIG. 4 or the interleaver 344 and interleaving software 354 shown and described above in connection with FIG. 3.

Figure 6:
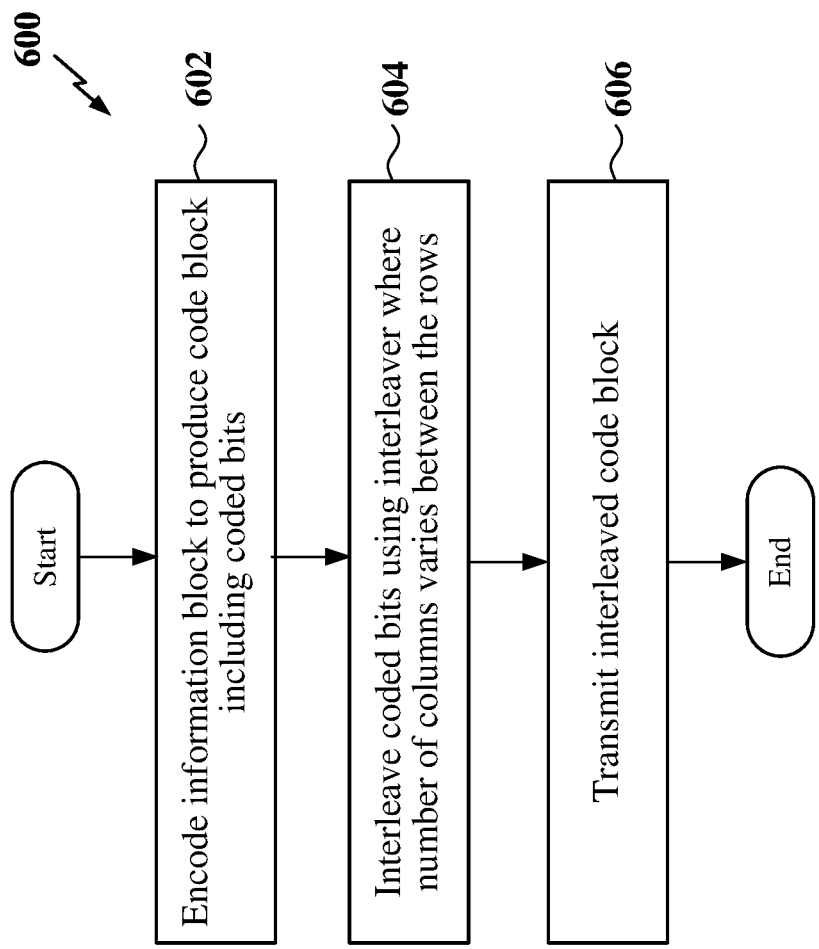
FIG. 6 is a flow chart illustrating an exemplary process for interleaving coded bits according to some aspects of the present disclosure.

FIG. 6 is a flow chart illustrating an exemplary process 600 for interleaving coded bits according to some aspects of the present disclosure. In some examples, the process 600 may be implemented by a wireless communication device as described above and illustrated in FIGS. 1-5. In some examples, the process 600 may be implemented by any suitable means for carrying out the described functions.

At block 602, the wireless communication device may encode an information block to produce a code block including a plurality of coded bits. In some examples, the information block may be encoded using polar coding. For example, the encoder 342 shown and described above in reference to FIG. 3 may encode the information block to produce the code block.

At block 604, the wireless communication device may interleave the plurality of coded bits in the code block to produce an interleaved code block. The coded bits may be interleaved utilizing an interleaver including a plurality of rows and a plurality of columns, where the number of columns varies between the rows. In some examples, the interleaver includes a right isosceles triangle-shaped matrix or trapezoid-shaped matrix of rows and columns. With the right isosceles triangle-shaped matrix, the number of rows in the first column is equal to the number of columns in the first row, and is further selected based on the number of coded bits in the code block. For example, the number of rows in the first column may be set to smallest integer P that satisfies the equation $P*(P+1)/2 \geq N$, where N is the number of coded bits in the code block. The coded bits may be fed into successive rows of the interleaver and read out from successive columns of the interleaver, such that the first coded bit in the code block is the first coded bit read out of the interleaver. For example, the interleaver 344 shown and described above in reference to FIG. 3 may interleave the coded bits in the code block to produce the interleaved code block.

At block 606, the wireless communication device may transmit the interleaved code block to a receiving wireless communication device over a wireless air interface. For example, the encoder 342, together with the transceiver 310, shown and described above in reference to FIG. 3 may transmit the interleaved code block to the receiving wireless communication device.

Figure 7:
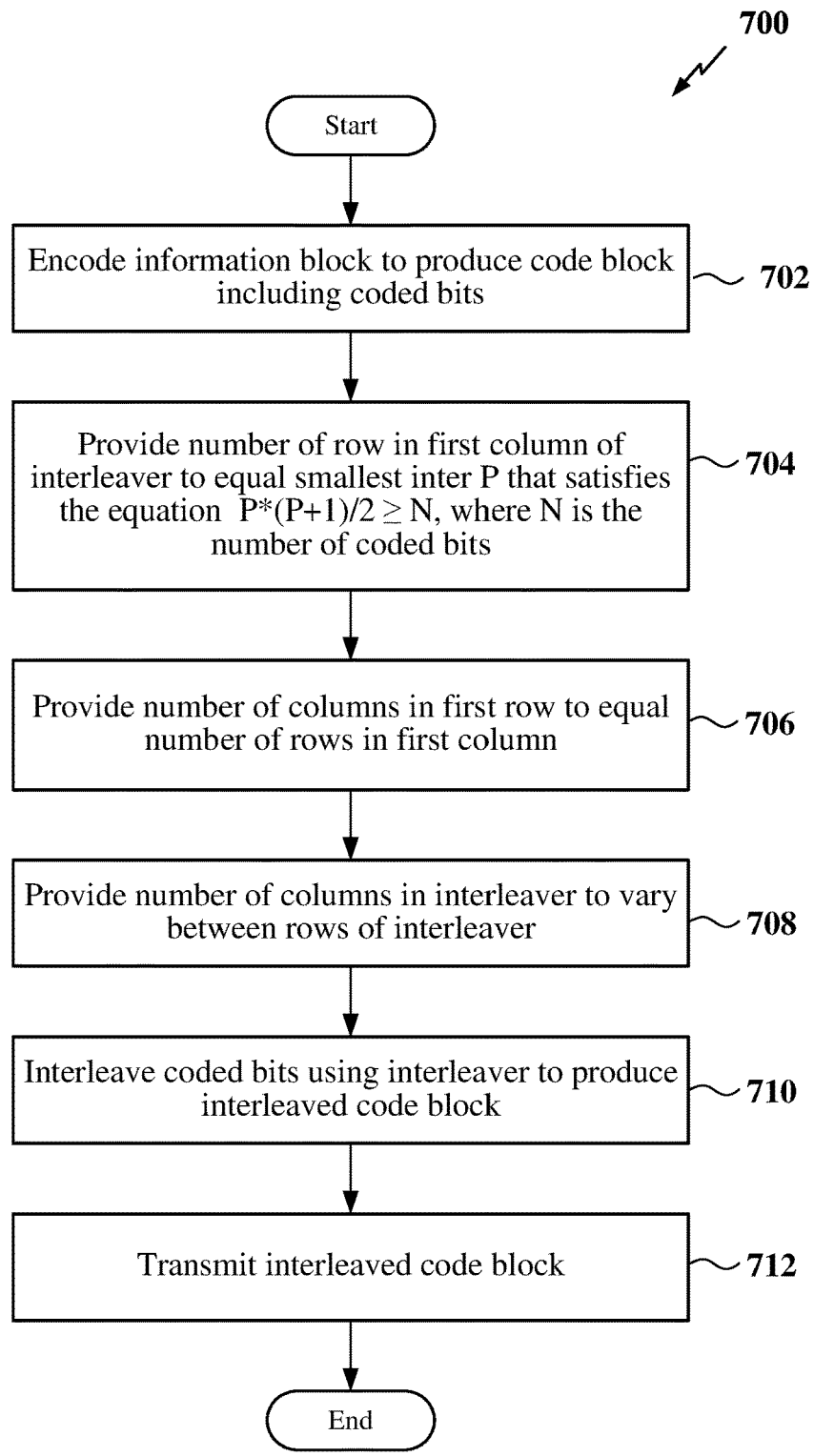
FIG. 7 is a flow chart illustrating another exemplary process for interleaving coded bits according to some aspects of the present disclosure.

FIG. 7 is a flow chart illustrating another exemplary process 700 for interleaving coded bits according to some aspects of the present disclosure. In some examples, the process 700 may be implemented by a wireless communication device as described above and illustrated in FIGS. 1-5. In some examples, the process 700 may be implemented by any suitable means for carrying out the described functions.

At block 702, the wireless communication device may encode an information block to produce a code block including a plurality of coded bits. In some examples, the information block may be encoded using polar coding. For example, the encoder 342 shown and described above in reference to FIG. 3 may encode the information block to produce the code block.

At block 704, the wireless communication device may provide a number of rows in a first column of an interleaver to equal the smallest integer P that satisfies the equation $P*(P+1)/2 \geq N$, where N is the number of coded bits in the code block. At block 706, the wireless communication device may provide the number of columns in the first row of in the interleaver to equal the number of rows in the first column. At block 708, the wireless communication device may provide the number of columns in the interleaver to vary between the rows of the interleaver. Such an interleaver design may produce, in some examples, a right isosceles triangle-shaped matrix or trapezoid-shaped matrix of rows and columns. For example, the interleaver 344 shown and described above in reference to FIG. 3 may provide the number of rows in the first column, the number of columns in the first row, and vary the number of columns between rows of a matrix corresponding to the interleaver 344.

At block 710, the wireless communication device may interleave the plurality of coded bits in the code block using the interleaver to produce an interleaved code block. The coded bits may be fed into successive rows of the interleaver and read out from successive columns of the interleaver, such that the first coded bit in the code block is the first coded bit read out of the interleaver. For example, the interleaver 344 shown and described above in reference to FIG. 3 may interleave the coded bits in the code block to produce the interleaved code block.

At block 712, the wireless communication device may transmit the interleaved code block to a receiving wireless communication device over a wireless air interface. For example, the encoder 342, together with the transceiver 310, shown and described above in reference to FIG. 3 may transmit the interleaved code block to the receiving wireless communication device.

Figure 8:
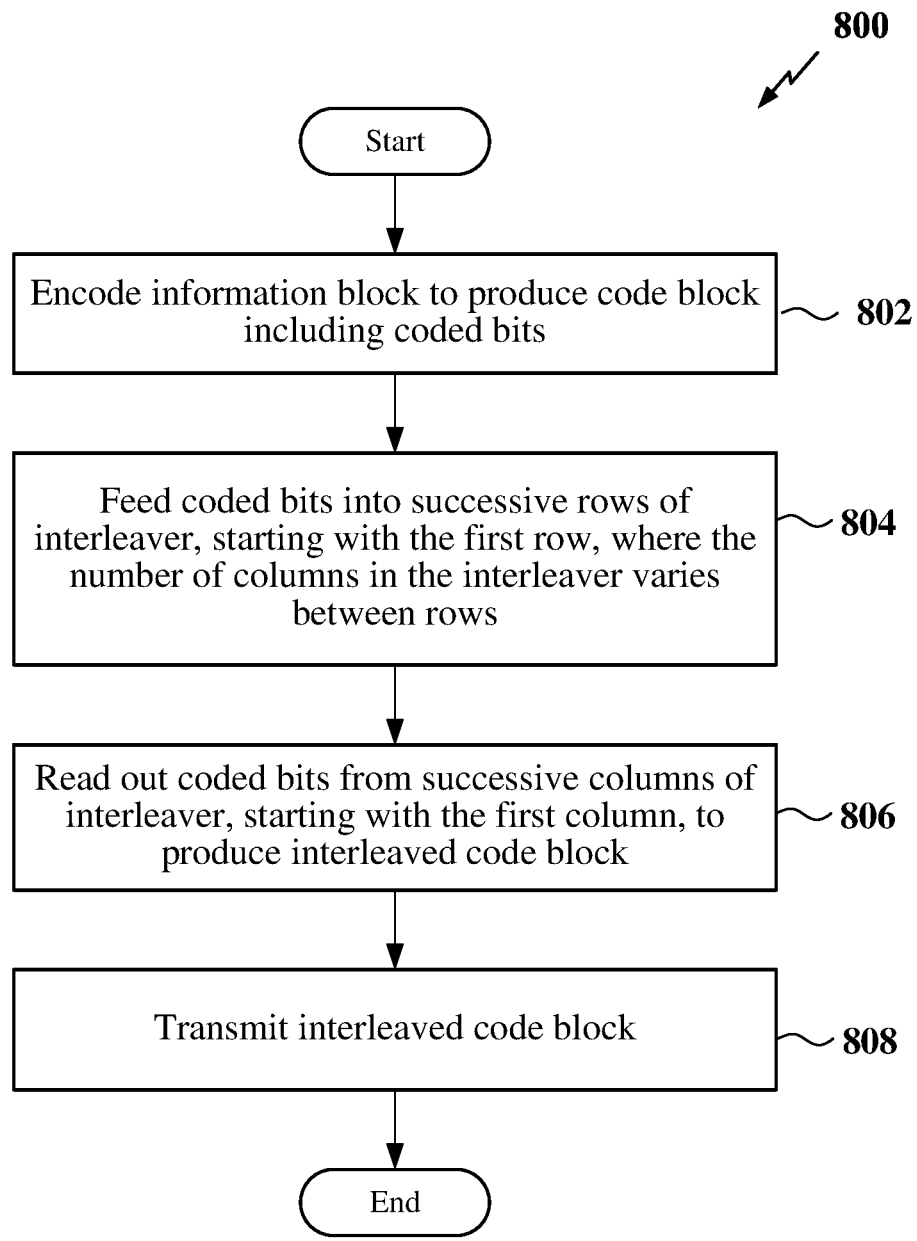
FIG. 8 is a flow chart illustrating another exemplary process for interleaving coded bits according to some aspects of the present disclosure.

FIG. 8 is a flow chart illustrating another exemplary process 800 for interleaving coded bits according to some aspects of the present disclosure. In some examples, the process 800 may be implemented by a wireless communication device as described above and illustrated in FIGS. 1-5. In some examples, the process 800 may be implemented by any suitable means for carrying out the described functions.

At block 802, the wireless communication device may encode an information block to produce a code block including a plurality of coded bits. In some examples, the information block may be encoded using polar coding. For example, the encoder 342 shown and described above in reference to FIG. 3 may encode the information block to produce the code block.

At block 804, the wireless communication device may feed the coded bits into successive rows of an interleaver, starting with the first row, where the number of columns in the interleaver varies between the rows. In some examples, the interleaver includes a right isosceles triangle-shaped matrix or trapezoid-shaped matrix of rows and columns. For example, the interleaver 344 shown and described above in reference to FIG. 3 may feed the coded bits in the code block into the successive rows of the interleaver.

At block 806, the wireless communication device may read out the coded bits from successive columns of the interleaver, starting with the first column, to produce an interleaved code block. For example, the interleaver 344 shown and described above in reference to FIG. 3 may read out the coded bits from successive columns of the interleaver.

At block 808, the wireless communication device may transmit the interleaved code block to a receiving wireless communication device over a wireless air interface. For example, the encoder 342, together with the transceiver 310, shown and described above in reference to FIG. 3 may transmit the interleaved code block to the receiving wireless communication device.

Figure 9:
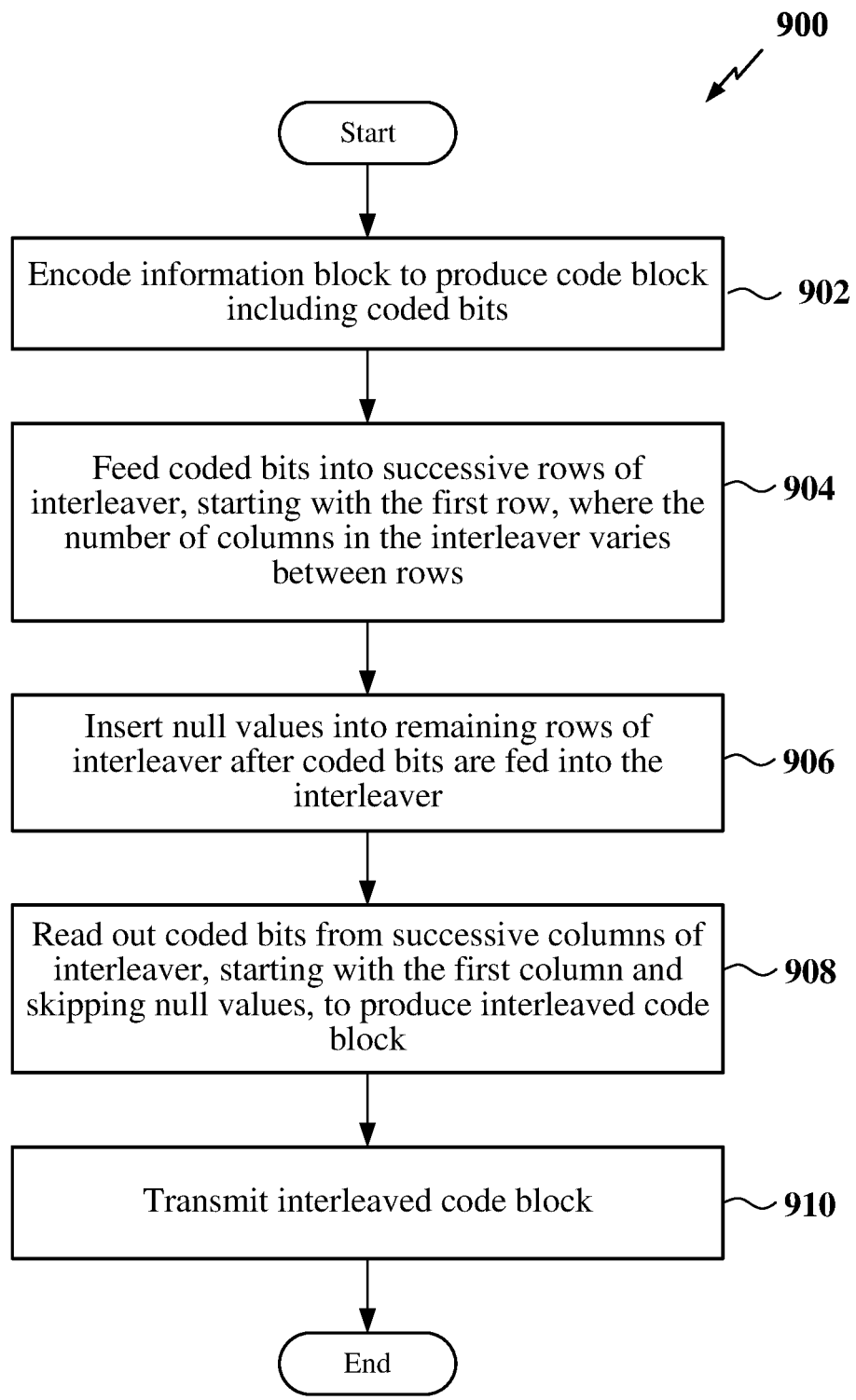
FIG. 9 is a flow chart illustrating another exemplary process for interleaving coded bits according to some aspects of the present disclosure.

FIG. 9 is a flow chart illustrating another exemplary process 900 for interleaving coded bits according to some aspects of the present disclosure. In some examples, the process 900 may be implemented by a wireless communication device as described above and illustrated in FIGS. 1-5. In some examples, the process 900 may be implemented by any suitable means for carrying out the described functions.

At block 902, the wireless communication device may encode an information block to produce a code block including a plurality of coded bits. In some examples, the information block may be encoded using polar coding. For example, the encoder 342 shown and described above in reference to FIG. 3 may encode the information block to produce the code block.

At block 904, the wireless communication device may feed the coded bits into successive rows of an interleaver, starting with the first row, where the number of columns in the interleaver varies between the rows. In some examples, the interleaver includes a right isosceles triangle-shaped matrix or trapezoid-shaped matrix of rows and columns. For example, the interleaver 344 shown and described above in reference to FIG. 3 may feed the coded bits in the code block into the successive rows of the interleaver.

At block 906, the wireless communication device may insert null values into remaining rows of the interleaver after the coded bits are fed into the interleaver. For example, the interleaver 344 shown and described above in reference to FIG. 3 may insert the null values into the remaining rows of the interleaver.

At block 908, the wireless communication device may read out the coded bits from successive columns of the interleaver, starting with the first column and skipping the null values, to produce an interleaved code block. For example, the interleaver 344 shown and described above in reference to FIG. 3 may read out the coded bits from successive columns of the interleaver.

At block 910, the wireless communication device may transmit the interleaved code block to a receiving wireless communication device over a wireless air interface. For example, the encoder 342, together with the transceiver 310, shown and described above in reference to FIG. 3 may transmit the interleaved code block to the receiving wireless communication device.

Figure 10:
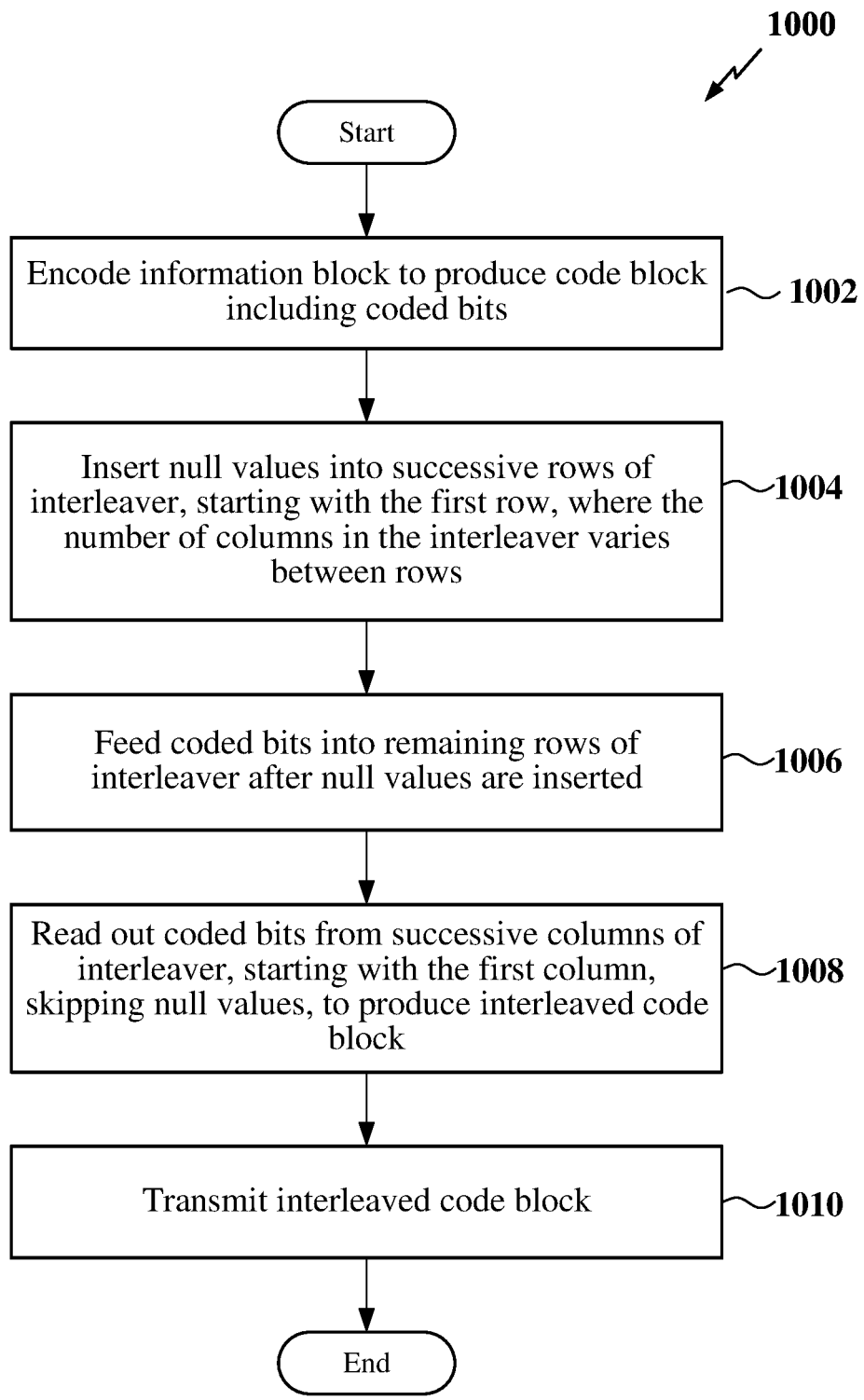
FIG. 10 is a flow chart illustrating another exemplary process for interleaving coded bits according to some aspects of the present disclosure.

FIG. 10 is a flow chart illustrating another exemplary process 1000 for interleaving coded bits according to some aspects of the present disclosure. In some examples, the process 1000 may be implemented by a wireless communication device as described above and illustrated in FIGS. 1-5. In some examples, the process 1000 may be implemented by any suitable means for carrying out the described functions.

At block 1002, the wireless communication device may encode an information block to produce a code block including a plurality of coded bits. In some examples, the information block may be encoded using polar coding. For example, the encoder 342 shown and described above in reference to FIG. 3 may encode the information block to produce the code block.

At block 1004, the wireless communication device may insert null values into successive rows of a matrix corresponding to an interleaver, starting with the first row, where the number of columns in the interleaver varies between the rows. In some examples, the interleaver includes a right isosceles triangle-shaped matrix or trapezoid-shaped matrix of rows and columns. In some examples, the number of null values is equal to the number of elements in the matrix less the number of coded bits For example, the interleaver 344 shown and described above in reference to FIG. 3 may insert null values into the successive rows of the interleaver.

At block 1006, the wireless communication device may feed the coded bits into remaining rows of the interleaver after the null values are inserted into the interleaver. For example, the interleaver 344 shown and described above in reference to FIG. 3 may feed the coded bits into the remaining rows of the interleaver.

At block 1008, the wireless communication device may read out the coded bits from successive columns of the interleaver, starting with the first column and skipping the null values, to produce an interleaved code block. For example, the interleaver 344 shown and described above in reference to FIG. 3 may read out the coded bits from successive columns of the interleaver.

At block 1010, the wireless communication device may transmit the interleaved code block to a receiving wireless communication device over a wireless air interface. For example, the encoder 342, together with the transceiver 310, shown and described above in reference to FIG. 3 may transmit the interleaved code block to the receiving wireless communication device.

In one configuration, an apparatus configured for wireless communication (e.g., the wireless communication device 202 shown in FIG. 2 and/or the wireless communication device 300 shown in FIG. 3) includes means for encoding an information block to produce a code block including a plurality of coded bits. The wireless communication device further includes means for interleaving the plurality of coded bits to produce an interleaved code block, where the means for interleaving includes a plurality of rows and a plurality of columns, and a number of the plurality of columns varies between the plurality of rows. The wireless communication device further includes means for transmitting the interleaved code block to a receiving wireless communication device over a wireless air interface.

In one aspect, the aforementioned means for encoding the information block may include the encoder 224 shown in FIG. 2, the processor(s) 304 shown in FIG. 3, the encoder 342 shown in FIG. 3, and/or the polar encoder 520 shown in FIG. 5. In another aspect, the aforementioned means for interleaving the coded bits may include the processor(s) 304 shown in FIG. 3, the interleaver 344 shown in FIG. 3, the interleaver 400 shown in FIG. 4 and/or the interleaver 540 shown in FIG. 5. In another aspect, the aforementioned means for transmitting the interleaved code block may include the transceiver 310 in combination with the processor(s) 304 shown in FIG. 3. In still another aspect, the aforementioned means may be a circuit or any apparatus configured to perform the functions recited by the aforementioned means.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-10 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-5 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of wireless communication at a transmitting wireless communication device, comprising:
   encoding an information block to produce a code block comprising a plurality of coded bits;
   interleaving the plurality of coded bits utilizing an interleaver to produce an interleaved code block, wherein the interleaver comprises a plurality of rows and a plurality of columns, wherein a number of the plurality of columns varies between the plurality of rows; and
   transmitting the interleaved code block to a receiving wireless communication device over a wireless air interface;
   wherein a number of rows in a first column of the plurality of columns and a number of columns in a first row of the plurality of rows are equal and selected based on a number of the plurality of coded bits in the code block;
   wherein the number of rows in the first column comprises a smallest integer P that satisfies an equation $P*(P+1)/2 \geq N$, where N comprises a number of the plurality of coded bits in the code block.

2. The method of claim 1, wherein interleaving the plurality of coded bits further comprises:
   feeding the plurality of coded bits into successive rows of the plurality of rows of the interleaver starting with a first row of the plurality of rows; and
   reading out the plurality of coded bits from successive columns of the plurality of columns of the interleaver starting with a first column of the plurality of columns;
   wherein a first one of the coded bits in the first row is a first one of the coded bits in the first column.

3. The method of claim 2, wherein a number of the plurality of coded bits between adjacent ones of the plurality of coded bits within adjacent ones of the plurality of rows varies between the plurality of rows.

4. The method of claim 2, wherein the interleaver comprises a right isosceles triangle-shaped matrix of the plurality of rows and the plurality of columns.

5. The method of claim 2, wherein interleaving the plurality of coded bits further comprises:
   inserting one or more null values into remaining ones of the plurality of rows after the plurality of coded bits are fed into the interleaver; and
   skipping the one or more null values when reading out the plurality of coded bits.

6. The method of claim 5, wherein the interleaver comprises a trapezoid-shaped matrix of the plurality of rows and the plurality of columns excluding the remaining ones of the plurality of rows containing the one or more null values.

7. The method of claim 1, wherein interleaving the plurality of coded bits further comprises:
   inserting one or more null values into successive rows of the plurality of rows of the interleaver starting with a first row of the plurality of rows, wherein a number of the one or more null values is equal to a number of elements in a matrix comprising the plurality of rows and the plurality of columns less a number of the plurality of coded bits;
   feeding the plurality of coded bits into remaining ones of the plurality of rows after the one or more null values are inserted into the interleaver;
   reading out the plurality of coded bits from successive columns of the plurality of columns of the interleaver starting with a first column of the plurality of columns; and
   skipping the one or more null values when reading out the plurality of coded bits.

8. The method of claim 1, wherein encoding the information block further comprises:
   polar coding the information block, wherein the code block comprises a polar code block.

9. An apparatus configured for wireless communication, the apparatus comprising:
   a processor;
   a transceiver communicatively coupled to the processor; and
   a memory communicatively coupled to the processor, wherein the processor is configured to:
     encode an information block to produce a code block comprising a plurality of coded bits;
     interleave the plurality of coded bits utilizing an interleaver to produce an interleaved code block, wherein the interleaver comprises a plurality of rows and a plurality of columns, wherein a number of the plurality of columns varies between the plurality of rows; and
     transmit the interleaved code block to a receiving wireless communication device over a wireless air interface via the transceiver;
     wherein a number of rows in a first column of the plurality of columns and a number of columns in a first row of the plurality of rows are equal and selected based on a number of the plurality of coded bits in the code block;
     wherein the number of rows in the first column comprises a smallest integer P that satisfies an equation $P*(P+1)/2 \geq N$, where N comprises a number of the plurality of coded bits in the code block.

10. The apparatus of claim 9, wherein the processor is further configured to:
  feed the plurality of coded bits into successive rows of the plurality of rows of the interleaver starting with a first row of the plurality of rows; and
  read out the plurality of coded bits from successive columns of the plurality of columns of the interleaver starting with a first column of the plurality of columns;
  wherein a first one of the coded bits in the first row is a first one of the coded bits in the first column.

11. The apparatus of claim 10, wherein a number of the plurality of coded bits between adjacent ones of the plurality of coded bits within adjacent ones of the plurality of rows varies between the plurality of rows.

12. The apparatus of claim 10, wherein the interleaver comprises a right isosceles triangle-shaped matrix of the plurality of rows and the plurality of columns.

13. The apparatus of claim 10, wherein the processor is further configured to:
  insert one or more null values into remaining ones of the plurality of rows after the plurality of coded bits are fed into the interleaver; and
  skip the one or more null values when reading out the plurality of coded bits.

14. The apparatus of claim 9, wherein the processor is further configured to:
  polar code the information block, wherein the code block comprises a polar code block.

15. An apparatus configured for wireless communication, the apparatus comprising:
  means for encoding an information block to produce a code block comprising a plurality of coded bits;
  means for interleaving the plurality of coded bits to produce an interleaved code block, wherein the means for interleaving comprises a plurality of rows and a plurality of columns, wherein a number of the plurality of columns varies between the plurality of rows; and
  means for transmitting the interleaved code block to a receiving wireless communication device over a wireless air interface;
  wherein a number of rows in a first column of the plurality of columns and a number of columns in a first row of the plurality of rows are equal and selected based on a number of the plurality of coded bits in the code block;
  wherein the number of rows in the first column comprises a smallest integer P that satisfies an equation $P*(P+1)/2 \geq N$, where N comprises a number of the plurality of coded bits in the code block.

16. The apparatus of claim 15, wherein the means for interleaving the plurality of coded bits further comprises:
  means for feeding the plurality of coded bits into successive rows of the plurality of rows starting with a first row of the plurality of rows; and
  means for reading out the plurality of coded bits from successive columns of the plurality of columns starting with a first column of the plurality of columns;
  wherein a first one of the coded bits in the first row is a first one of the coded bits in the first column.

17. The apparatus of claim 16, wherein a number of the plurality of coded bits between adjacent ones of the plurality of coded bits within adjacent ones of the plurality of rows varies between the plurality of rows.

18. The apparatus of claim 16, wherein the means for interleaving the plurality of coded bits further comprises:
  means for inserting one or more null values into remaining ones of the plurality of rows after the plurality of coded bits; and
  means for skipping the one or more null values when reading out the plurality of coded bits.

19. The apparatus of claim 15, wherein the means for encoding the information block further comprises:
  means for polar coding the information block, wherein the code block comprises a polar code block.

20. A non-transitory computer-readable medium storing computer executable code, comprising code that when executed by a processor at a transmitting wireless communication device causes the transmitting wireless communication device to:
  encode an information block to produce a code block comprising a plurality of coded bits;
  interleave the plurality of coded bits utilizing an interleaver to produce an interleaved code block, wherein the interleaver comprises a plurality of rows and a plurality of columns, wherein a number of the plurality of columns varies between the plurality of rows; and
  transmit the interleaved code block to a receiving wireless communication device over a wireless air interface;
  wherein a number of rows in a first column of the plurality of columns and a number of columns in a first row of the plurality of rows are equal and selected based on a number of the plurality of coded bits in the code block;
  wherein the number of rows in the first column comprises a smallest integer P that satisfies an equation $P*(P+1)/2 \geq N$, where N comprises a number of the plurality of coded bits in the code block.

21. The non-transitory computer-readable medium of claim 20, further comprising code for causing the transmitting wireless communication device to:
  feed the plurality of coded bits into successive rows of the plurality of rows of the interleaver starting with a first row of the plurality of rows; and
  read out the plurality of coded bits from successive columns of the plurality of columns of the interleaver starting with a first column of the plurality of columns;
  wherein a first one of the coded bits in the first row is a first one of the coded bits in the first column.

22. The non-transitory computer-readable medium of claim 21, wherein a number of the plurality of coded bits between adjacent ones of the plurality of coded bits within adjacent ones of the plurality of rows varies between the plurality of rows.

* * * * *